United States Patent
Miyaji et al.

(10) Patent No.: US 9,618,575 B2
(45) Date of Patent: Apr. 11, 2017

(54) SEMICONDUCTOR DEVICE HAVING PLURAL DATA INPUT/OUTPUT TERMINALS CONFIGURED FOR WRITE TEST AND READ TEST OPERATIONS

(71) Applicant: PS4 Luxco S.a.r.l., Luxembourg (LU)

(72) Inventors: Teppei Miyaji, Tokyo (JP); Yoshinori Matsui, Tokyo (JP)

(73) Assignee: Longitude Semiconductor S.a.r.l., Luxembourg (LU)

( * ) Notice: Subject to any disclaimer, the term of this patent is extended or adjusted under 35 U.S.C. 154(b) by 590 days.

(21) Appl. No.: 13/828,711

(22) Filed: Mar. 14, 2013

(65) Prior Publication Data

US 2013/0265831 A1   Oct. 10, 2013

(30) Foreign Application Priority Data

Apr. 4, 2012 (JP) .................................. 2012-085298
Feb. 25, 2013 (JP) .................................. 2013-034438

(51) Int. Cl.

| G11C 29/32 | (2006.01) |
|---|---|
| G11C 11/401 | (2006.01) |
| G01R 31/28 | (2006.01) |
| G11C 7/10 | (2006.01) |
| G11C 29/00 | (2006.01) |
| G11C 29/12 | (2006.01) |
| G11C 29/56 | (2006.01) |

(52) U.S. Cl.
CPC ............ G01R 31/2894 (2013.01); G11C 7/10 (2013.01); G11C 29/006 (2013.01); G11C 29/1201 (2013.01); G11C 29/32 (2013.01); G11C 11/401 (2013.01); G11C 2029/5602 (2013.01)

(58) Field of Classification Search
CPC .................... H01L 2924/00; G11C 2029/2602
See application file for complete search history.

(56) References Cited

U.S. PATENT DOCUMENTS

| 7,707,467 B2 * | 4/2010 | Louie ............... G01R 31/31854 714/30 |
| 2003/0126524 A1 * | 7/2003 | Kashihara ........ G01R 31/31854 714/718 |
| 2008/0209284 A1 * | 8/2008 | Louie ............... G01R 31/31854 714/718 |

FOREIGN PATENT DOCUMENTS

| JP | 05-74898 | 3/1993 |
| JP | 2001-57100 | 2/2001 |

* cited by examiner

Primary Examiner — Hoai V Ho
Assistant Examiner — Roberto Mancera

(57) ABSTRACT

Disclosed herein is a device that includes a plurality of first terminals; a first circuit including a plurality of first nodes; a buffer circuit including a plurality of second nodes connected to the first terminals through a plurality of first interconnection lines, respectively, and a plurality of third nodes connected to the first nodes of the first circuit through a plurality of second interconnection lines, respectively; and a second circuit configured to perform at least one of first and second operations. The first operation is such that a plurality of first signals, that appear respectively on the first interconnection lines, are outputted in series, and the second operation is such that a plurality of second signals, that are supplied in series, are transferred respectively to the first interconnection lines.

11 Claims, 15 Drawing Sheets

|  | TM1 | TM2 | TM3 |
|---|---|---|---|
| WRITE TEST OPERATION | H | H | L |
| READ TEST OPERATION | H | H | L |
| LEAK TEST OPERATION | H | L | L |
| LEAK TEST OPERATION(DM1) | H | L | H |
| NORMAL OPERATION | L | L | L |

FIG.4

SEMICONDUCTOR DEVICE HAVING PLURAL DATA INPUT/OUTPUT TERMINALS CONFIGURED FOR WRITE TEST AND READ TEST OPERATIONS

BACKGROUND OF THE INVENTION

Field of the Invention

The present invention relates to a semiconductor device and a test method therefor, and more particularly relates to a semiconductor device including a plurality of data input/output terminals and a test method therefor.

Description of Related Art

Various operation tests are performed at each step in a process of manufacturing a semiconductor device. For example, Japanese Patent Application Laid-open No. H5-74898 discloses that a screening test of a semiconductor memory device such as a DRAM (Dynamic Random Access Memory) is performed in a wafer state and then a final test is performed for a packaged semiconductor memory device. It is desirable that the screening test in a wafer state be executed for many semiconductor memory devices in parallel. However, if all data input/output terminals thereof are connected to a probe card, fewer semiconductor memory devices can be tested in parallel and accordingly a method of performing the test using some of the data input/output terminals is proposed (see Japanese Patent Application Laid-open No. 2001-57100).

In the final test after packaging, the semiconductor memory device needs to be operated in a state closer to that in a normal operation than in the screening test. Therefore, all of the data input/output terminals are connected to a tester to write individual test data to each of the data input/output terminals.

As shipment forms of semiconductor memory devices, there is a form in which semiconductor memory devices are shipped in a wafer state in addition to the form in which the packaged semiconductor memory devices are shipped as described in Japanese Patent Application Laid-open No. H5-74898. Also when the semiconductor memory devices are shipped in a wafer state, the final test mentioned above needs to be performed to ensure product quality.

However, when the final test is performed in a wafer state, probe needles of the probe card need to be applied to all data input/output terminals of the semiconductor memory devices to write individual test data to each of the data input/output terminals. Accordingly, the number of semiconductor memory devices that can be tested at the same time is reduced, which increases a test time. When the screening test described in Japanese Patent Application Laid-open No. 2001-57100 is adapted to the final test in a wafer state, the tester can receive read data not being compressed; however, arbitrary test data cannot be written to each of the data input/output terminals.

SUMMARY

In one embodiment, there is provided a semiconductor that includes: a plurality of first terminals; a plurality of second terminals, the second terminals being configured to receive a plurality of first test data in serial in a first test operation and to receive a shift clock signal in a second test operation; a third terminal; a plurality of buffer circuits; a plurality of data input/output lines each coupled between an associated one of the first terminals and an associated one of the buffer circuits; and a plurality of test circuit units each coupled to an associated one of the data input/output lines, the test circuit units being connected in series. In the first test operation, the plurality of first test data are sequentially supplied to the test circuit units, and the test circuit units supply the plurality of first test data to the data input/output lines in parallel. In the second test operation, a plurality of second test data supplied from the buffer circuits are supplied in parallel to the test circuit units, and the test circuit units serially output the plurality of second test data through the third terminal synchronously with the shift clock signal.

In another embodiment, there is provided a device that includes a plurality of first terminals; a first circuit including a plurality of first nodes; a buffer circuit including a plurality of second nodes connected to the first terminals through a plurality of first interconnection lines, respectively, and a plurality of third nodes connected to the first nodes of the first circuit through a plurality of second interconnection lines, respectively; and a second circuit configured to perform at least one of first and second operations. The first operation is such that a plurality of first signals, that appear respectively on the first interconnection lines, are outputted in series, and the second operation is such that a plurality of second signals, that are supplied in series, are transferred respectively to the first interconnection lines.

In still another embodiment, such a device is provided that includes: a memory cell array including a plurality of memory cells; a read/write control unit performing, on selected ones of the memory cells, a data read operation to produce a plurality of read signals therefrom and a data write operation to write a plurality of write signals thereinto; a plurality of read bus lines receiving the read signals, respectively; a plurality of write bus lines receiving the write signals, respectively; a plurality of first terminals; a plurality of data buffers each including a first node connected to an associated one of the first terminals, a second node connected to an associated one of the read bus lines, and a third node connected to an associated one of the write bus lines, each of the data buffers forming an electrical path between the first and second nodes during the data read operation and between the first and third nodes during the data write operation; second and third terminals; and an auxiliary circuit that comprises first and second circuits. The first circuit is coupled to the first nodes of the data buffers and the second terminal and configured, when activated, to receive in parallel the read signals from the first nodes of the buffer circuits and transfer in series the read signals to the second terminal, and the second circuit is coupled to the first nodes of the data buffers and the third terminal and configured, when activated, to receive in series the write signals from the third terminals and transfer in parallel the write signals to the first nodes of the buffer circuit.

BRIEF DESCRIPTION OF THE DRAWINGS

FIG. 4 is a truth table of the test mode signals;

DETAILED DESCRIPTION OF THE EMBODIMENTS

Figure 1:
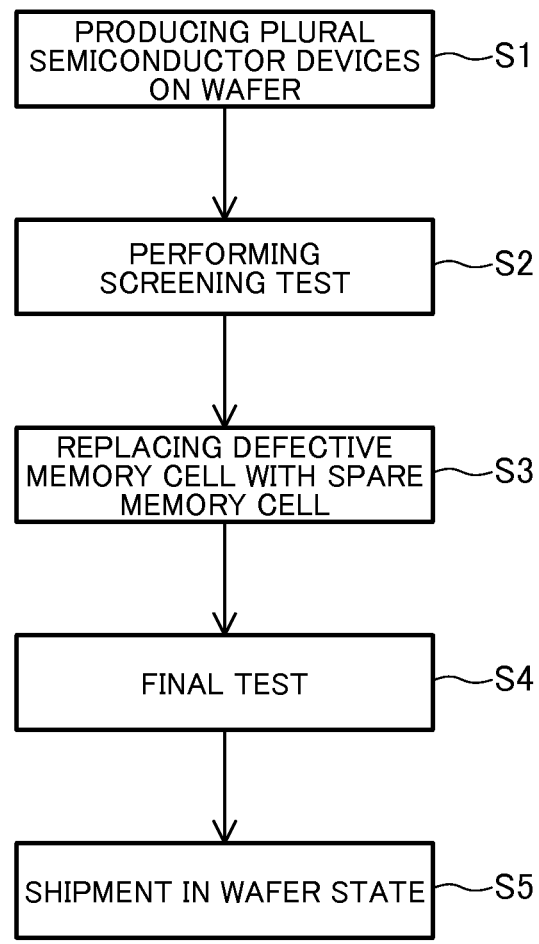
FIG. 1 is a flowchart for explaining a manufacturing process of a semiconductor device.

Referring now to FIG. 1, in a manufacturing process of a semiconductor device, a large number of semiconductor devices are produced on a wafer (Step S1) and then a screening test is performed in a wafer state (Step S2), Semiconductor devices are produced in a process of forming devices by performing ion implantation to a wafer made of silicon, formation of a conductive film and an insulating film on the wafer, patterning of these films, and the like. Although not particularly limited thereto, the semiconductor devices produced in the present embodiment are DRAMs and therefore many memory cells are formed in each of the semiconductor devices on the wafer. The screening test is a process of determining whether a read operation and a write operation can be correctly performed to these memory cells. A defective memory cell found in the screening test is replaced by a spare memory cell. In this way, an address corresponding to the defective memory cell is relieved (Step S3).

After the address corresponding to the defective memory cell is relieved, a pre-shipment final test is performed (Step S4). The final test is a process of finally confirming whether there is no defective memory cell by inputting/outputting individual test data through each of the data input/output terminals. Accordingly, in the final test, probe needles of a probe card generally need to be applied to all data input/output terminals included in each of the semiconductor devices. However, in the present embodiment, there is no need for that and it suffices to apply a probe needle to a data mask terminal included in each of the semiconductor devices. This enables the final test to be performed for many semiconductor devices on the wafer in parallel.

Figure 2:
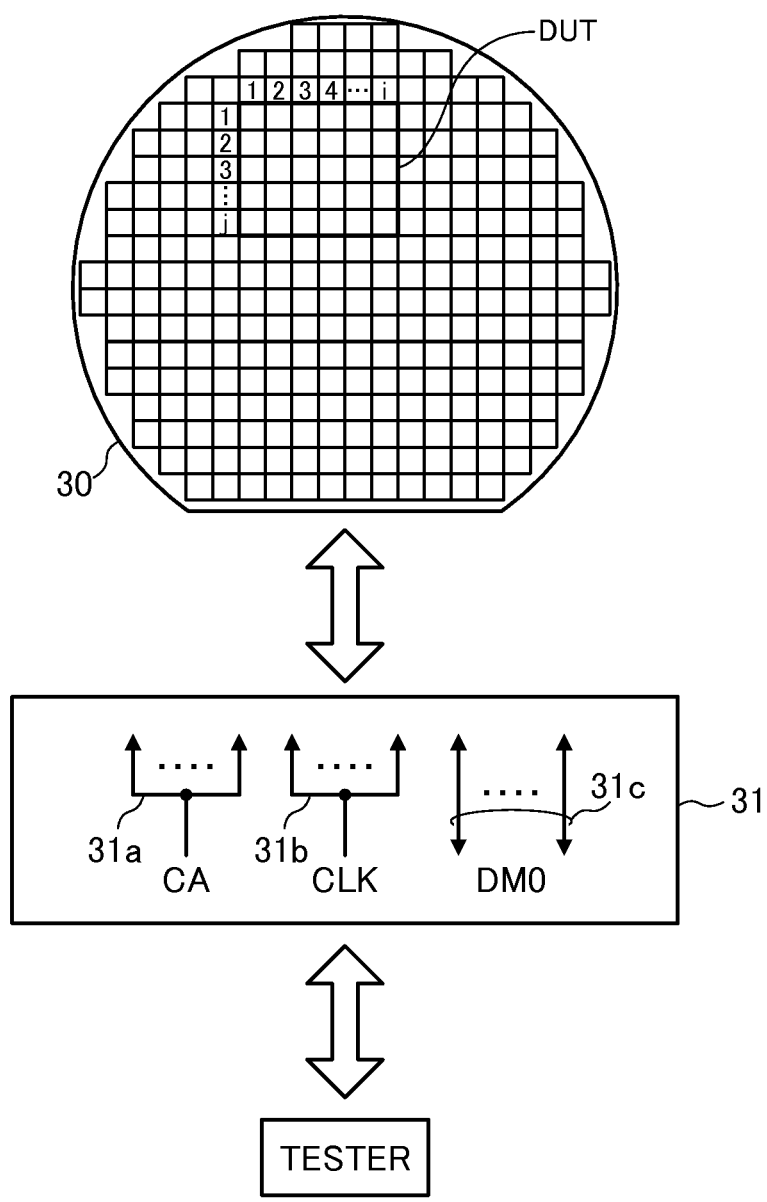
FIG. 2 show a configuration of a probe card for using an operation test of the semiconductor device in a wafer state.

Specifically, as shown in FIG. 2, the pre-shipment final test is performed in parallel for i×j semiconductor devices among semiconductor devices included in a semiconductor wafer 30. The i×j semiconductor devices tested in parallel are so-called DUTs (Devices Under Test). The number of DUTs depends on a configuration of a probe card 31 provided in a tester.

The probe card 31 has many probes for contacting terminals included in the semiconductor devices as test targets, and probes 31a for supplying a command address signal CA and probes 31b for supplying an external clock signal CLK are connected in common to chips as shown in FIG. 2. This is because it is unnecessary to supply an individual command address signal CA or an individual external clock signal CLK to each of the semiconductor devices in the final test and it suffices to supply these signals in common to all the semiconductor devices.

On the other hand, at least read test data need to be different for each of the chips, and therefore probes 31c for connecting to data mask terminals DM0 are not connected in common but are individually connected to each of the chips. In the present embodiment, even when each of the semiconductor devices includes a plurality of data mask terminals DM0, DM1, . . . , it suffices to use one of these data mask thermals, that is, the data mask terminal DM0. The data mask terminal DM0 is used as an output terminal for read test data in the final test of the present embodiment, details of which will be explained later. A command address terminal CAp is used for an input terminal of write test data. This is because write test data to be input to the semiconductor devices can be common to the semiconductor devices while read test data output from the semiconductor devices need to be different for each of the semiconductor devices.

When the final test has been passed, the semiconductor devices are shipped in the wafer state as non-defective products (Step S5). The semiconductor devices that have not passed the final test are, for example, marked on the wafer and discarded after dicing. A semiconductor device that can be subjected to the final test will be explained in detail below.

Figure 3:
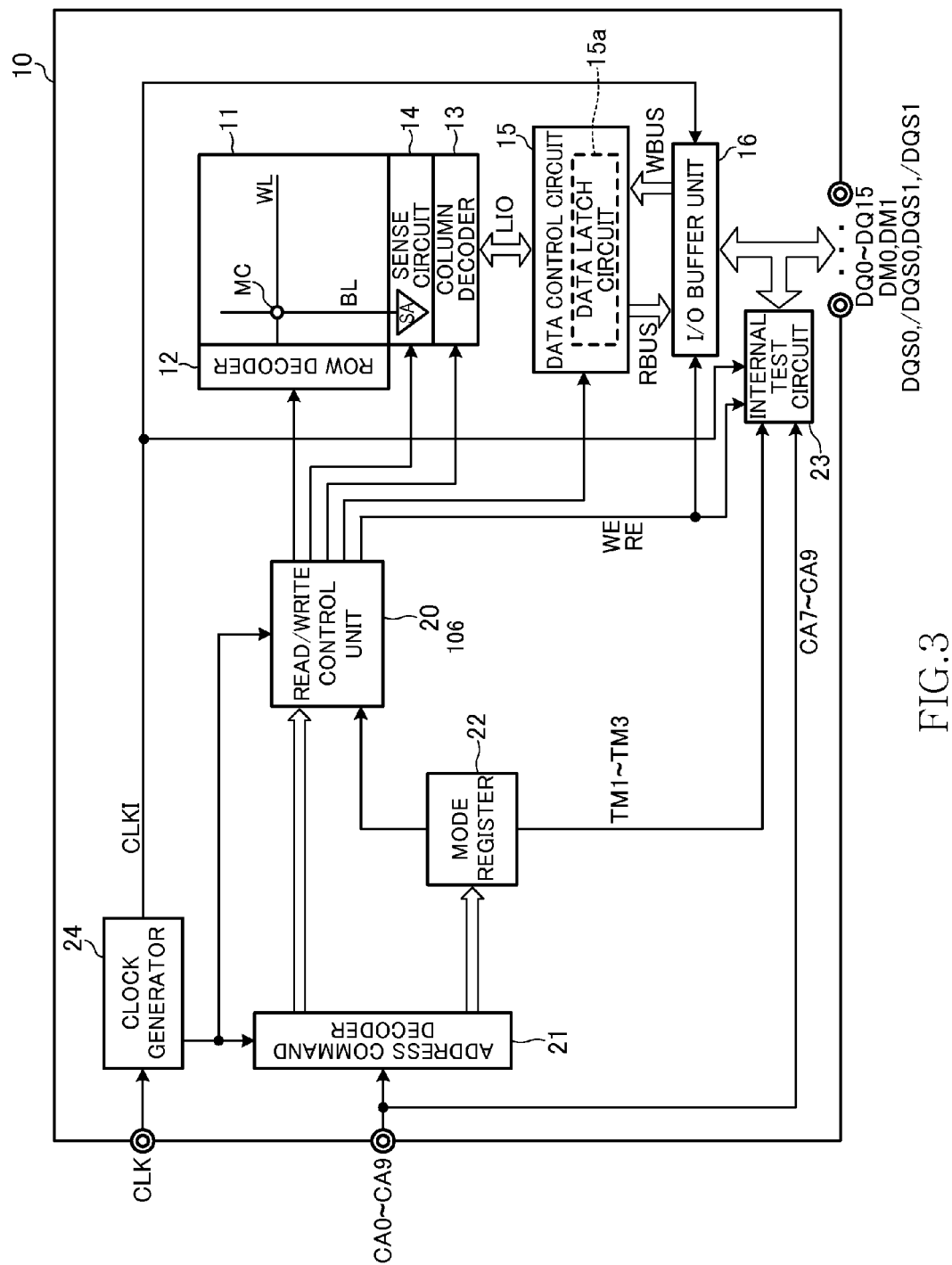
FIG. 3 is a block diagram showing a configuration of a semiconductor device according to a first embodiment of the present invention.

Turing to FIG. 3, the semiconductor device 10 according to the first embodiment of the present invention is a DRAM and includes a memory cell array 11. In the memory cell array 11, a plurality of word lines WL and a plurality of bit lines BL intersect with each other and a memory cell MC is arranged at each intersection therebetween (only one word line WL, one bit line BL, and one memory cell MC are shown in FIG. 3). Selection of a word line WL is performed by a row decoder 12 and selection of a bit line BL is performed by a column decoder 13. The bit lines BL are connected to corresponding sense amplifiers SA in a sense circuit 14, respectively, and a bit line BL selected by the column decoder 13 is connected to a data control circuit 15 via a data input/output line LIO.

The data control circuit 15 functions to perform parallel-serial conversion of read data supplied via the data input/output line LIO to supply the converted data to a read bus RBUS, and to perform serial-parallel conversion of write data supplied via a write bus WBUS to supply the converted data to the data input/output line LIO. The data control circuit 15 includes a data latch circuit 15a required for these conversion operations.

The read bus RBUS and the write bus WBUS are connected to an I/O buffer unit 16. The I/O buffer unit 16 functions to output the read data supplied via the read bus RBUS to data input/output terminals DQ0 to DQ15 and to output the write data supplied via the data input/output terminals DQ0 to DQ15 to the write bus WBUS. In the present specification, a signal and a terminal for inputting or outputting the signal are also denoted by the same reference characters. For example, the read data and the write data are also denoted by reference characters DQ0 to DQ15 to be referred to as "read data DQ0 to DQ15" and "write data DQ0 to DQ15", respectively. The same holds true for other signals and terminals.

The I/O buffer unit 16 is also connected to a plurality of data strobe terminals DQS and data mask terminals DM, and outputs a data strobe signal DQS in a read operation while the data strobe signal DQS and a data mask signal DM are input to the I/O buffer unit 16 in a write operation. The data strobe signal DQS is a signal for specifying an input/output timing of the read data or the write data and the data mask signal DM is a signal for masking the write data. As explained later, the data strobe terminal DQS includes four terminals DQS0, /DQS0, DQS1, and /DQS1 and the data mask terminal DM includes two terminals DM0 and DM1. In the present specification, the data input/output terminals DQ0 to DQ15 and the data strobe terminal DQS are also referred to as "first terminal" and the data mask terminal DM0 is also referred to as "third terminal".

Operations of the row decoder 12, the column decoder 13, the sense circuit 14, the data control circuit 15, and the I/O buffer unit 16 are controlled by a read/write control unit 20 based on a command address signal CA. The command address signal CA is supplied from outside and is decoded by an address command decoder 21. The decoded signal is supplied to the read/write control unit 20 and a mode register 22. In the present specification, a command address terminal to which the command address signal CA is supplied is also referred to as "second terminal".

Specifically, when the command address signal CA indicates a row access, a row address included in the command address signal CA is supplied to the row decoder 12, thereby selecting one or ones of the word lines WL in the memory cell array 11. When the command address signal CA indicates a column access, a column address included in the command address signal CA is supplied to the column decoder 13, thereby selecting one or ones of the bit lines BL in the memory cell array 11. Therefore, when the column access is a read access, read data that are read from selected memory cells MC are output via the data input/output terminals DQ0 to DQ15. When the column access is a write access, write data that are input via the data input/output terminals DQ0 to DQ15 are written in the selected memory cells MC.

When the command address signal CA indicates mode register set, a set value in the mode register 22 is rewritten. The mode register 22 is a register in which an operation mode of the semiconductor device 10 is set and a set value therein is supplied to the read/write control unit 20 and the like. When a test mode is set in the mode register 22, test mode signals TM1 to TM3 are generated. The test mode signals TM1 to TM3 are supplied to an internal test circuit 23 and then the internal test circuit 23 performs various test operations, which will be explained later, based on these signals. The internal test circuit 23 is connected to data input/output lines that are connected between the I/O buffer unit 16 and the data input/output terminals DQ0 to DQ15, the data strobe terminal DQS, and the data mask terminal DM, details of which will be explained later.

Turning to FIG. 4, the test mode signals TM1 to TM3 are all at a low level in a normal operation. In a write test operation and a read test operation, the test mode signals TM1 and TM2 are at a high level and the test mode signal TM3 is at a low level. The test mode signal TM1 is at a high level and the test mode signals TM2 and TM3 are at a low level in a leak test operation. In a leak test operation for the data mask terminal DM1, the test mode signals TM1 and TM3 are at a high level and the test mode signal TM2 is at a low level.

In the test operation, command address signals CA7 to CA9, which are parts of the command address signal CA, are also used. The command address signal CA7 is used to select one of two groups, which will be explained later, in a read test operation. The command address signal CA8 is used as write test data in a write test operation. The command address signal CA9 is used as a shift clock signal in a read test operation and a write test operation.

Referring back to FIG. 3, an external clock signal CLK is supplied to the semiconductor device 10. The external clock signal CLK is supplied to a clock generator 24. The clock generator 24 generates an internal clock signal CLKI based on the external clock signal CLK. The internal clock signal CLKI is supplied to various circuit blocks such as the read/write control unit 20 and the internal test circuit 23.

Figure 5:
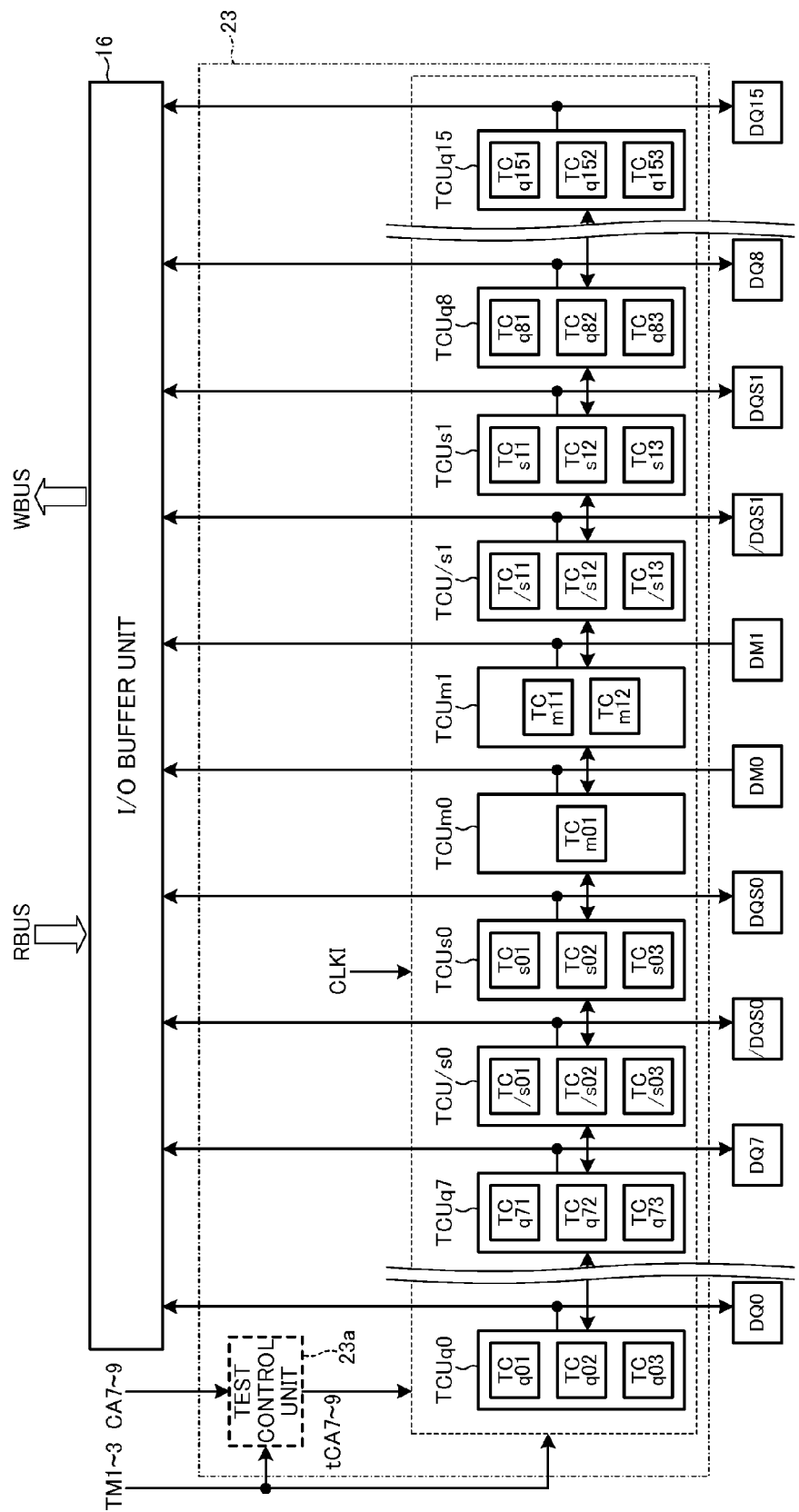
FIG. 5 is a block diagram showing a configuration of the internal test circuit shown in FIG. 3.
Figure 6:
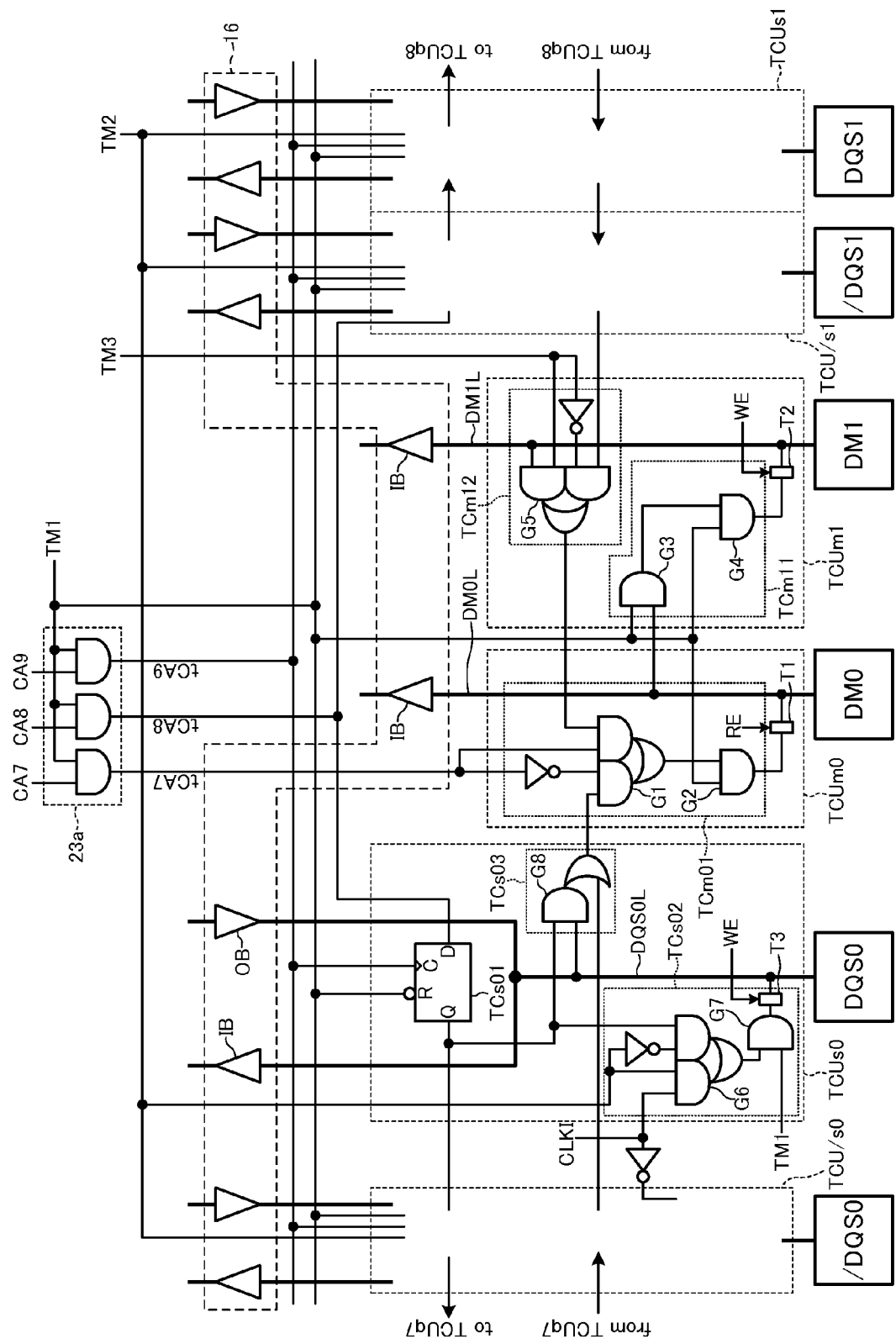
FIG. 6 is a circuit diagram of the test circuit units TCUm0, TCUm1, and TCUs0 shown in FIG. 5.

Turning to FIG. 5, the internal test circuit 23 includes a test control unit 23a and a plurality of test circuit units TCU. The test control unit 23a is activated according to the test mode signal TM1 and functions to convert the command address signals CA7 to CA9 into test control signals tCA7 to tCA9, respectively. The test control unit 23a has a circuit configuration as shown in FIG. 6 and includes three AND gate circuits that receive the command address signals CA7 to CA9, respectively. With this configuration, when the test mode signal TM1 is activated to a high level, the command address signals CA7 to CA9 are output with no change as the test control signal tCA7 to tCA9, respectively.

The test circuit units TCU are connected to corresponding terminals, respectively. Adjacent ones of the test circuit units TCU are connected with each other, thereby realizing a configuration in which the test circuit units TCU are cascaded. The test circuit units TCU include test circuit units TCUq0 to TCUq15 assigned to the data input/output terminals DQ0 to DQ15, respectively, test circuit units TCUs0, TCU/s0, TCUs1, and TCU/s1 assigned to the data strobe terminals DQS0, /DQS0, DQS1, and /DQS1, respectively, and test circuit units TCUm0 and TCUm1 assigned to the data mask terminals DM0 and DM1, respectively.

The test circuit units TCUq0 to TCUq15 have the same circuit configuration and each include circuits TCqi1 to TCqi3 (i=0 to 15). The circuits TCqi1 are latch circuits and cascade connection thereof form a shift register, details of which will be explained later. The shift register is used for shift of write test data in a write test operation and is used for selection of read test data in a read test operation. The circuits TCqi2 and TCqi3 are logic gate circuits and are used in a write test operation and a read test operation, respectively.

The test circuit units TCUs0, TCU/s0, TCUs1, and TCU/s1 have the same circuit configuration and each include similar circuits to those in the test circuit units TCUq0 to TCUq15. The test circuit unit TCUm0 includes a circuit TCm01 being a logic gate circuit, and the test circuit unit TCUm1 includes circuits TCm11 and TCm12 being logic gate circuits.

In the semiconductor device 10 according to the present embodiment, the data mask terminal DM0 is the only data-related terminal to be used in a test operation and other data-related terminals (DQ and DQS) are not used. In the present embodiment, the test circuit units TCUq0 to TCUq7, TCUs0, and TCU/s0 located on the left side of FIG. 5 in relation to the data mask terminal DM0 form one group and the test circuit units TCUq8 to TCUq15, TCUs1, TCU/s1, and TCUm1 located on the right side in relation to the data mask terminal DM0 form another group. A plurality of read test data serially output from these two groups are gathered to the test circuit unit TCUm0 corresponding to the data mask terminal DM0. A plurality of write test data serially input are supplied in common to these two groups.

A more specific circuit configuration of the test circuit unit TCU is explained below with reference to FIGS. 6 and 7.

As shown in FIG. 6, the circuit TCm01 included in the test circuit unit TCUm0 includes a complex gate circuit G1 that selects either the read test data DQ0 to DQ7 or the read test data DQ8 to DQ15 based on the test control signal tCA7. An output signal from the complex gate circuit G1 and the test mode signal TM1 are supplied to an AND gate circuit G2 and an output signal from the AND gate circuit G2 is supplied to a data mask line DM0L via a transfer gate circuit T1. The transfer gate circuit T1 is brought into a conductive state in response to a read enable signal RE. Instead of using the transfer gate circuit T1, the AND gate circuit G2 can be adapted as a tristate type that is activated according to the read enable signal RE.

The read enable signal RE is generated by the read/write control unit 20 when the command address signal CA indicates a read operation. Therefore, in a read test operation, the read test data DQ0 to DQ15 are supplied to the data mask terminal DM0 via the data mask line DM0L. In a write test operation, the data mask signal supplied to the data mask terminal DM0 is supplied to an input buffer IB in the I/O buffer unit 16.

The circuit TCm11 included in the test circuit unit TCUm1 includes an AND gate circuit G3 that has one of input nodes connected to the data mask line DM0L and the other input node to which the test mode signal TM1 is supplied, and an AND gate circuit G4 that receives an output signal from the AND gate circuit G3 and the test mode signal TM1. An output signal from the AND gate circuit G4 is supplied to a data mask line DM1L via a transfer gate circuit T2. The transfer gate circuit T2 is brought into conduction in response to a write enable signal WE. Instead of using the transfer gate circuit T2, the AND gate circuit G4 can be adapted as a tristate type that is activated according to the write enable signal WE.

The write enable signal WE is generated by the read/write control unit 20 when the command address signal CA indicates a write operation. Therefore, in a write test operation, the data mask signal supplied to the data mask terminal DM0 is also supplied to the data mask line DM1L.

The circuit TCm12 included in the test circuit unit TCUm1 includes a complex gate circuit G5 that selects either the read test data DQ7 to DQ15 or a signal on the data mask line DM1L based on the test mode signal TM3. An output signal from the complex gate circuit G5 is input to the complex gate circuit G1. With this configuration, when the test mode signal TM3 is at a low level, the read test data DQ7 to DQ15 transferred from the test circuit units TCU at the previous stages are supplied with no change to the test circuit TCUm0 via the test circuit TCUm1. When the test mode signal TM3 is at a high level, the signal on the data mask line DM1L is supplied to the test circuit unit TCUm0.

A circuit TCs01 included in the test circuit unit TCUs0 is a latch circuit and has a data input node D, a data output node Q, a clock input node C, and a reset input node R. The test control signal tCA8 is supplied to the data input node D and the data output node Q is connected to the data input node D of a latch circuit included in the test circuit unit TCU at the subsequent stage. The test control signal tCA9 is supplied to the clock input node C. Also in latch circuits included in other test circuit units TCU, the test control signal tCA9 is supplied to the clock input node C, so that the latch circuits included in the test circuit units TCU form a shift register. The test mode signal TM1 is supplied to the reset input node R and the latch circuits are all reset in a normal operation.

The circuit TCs02 included in the test circuit unit TCUs0 includes a complex gate circuit G6 that selects either the internal clock signal CLKI or an output signal from the latch circuit TCs01 based on the test mode signal TM2. An output signal from the complex gate circuit G6 and the test mode signal TM1 are supplied to an AND gate circuit G7 and an output signal from the AND gate circuit G7 is supplied to a data strobe line DQS0L via a transfer gate circuit T3. The transfer gate circuit T3 is brought into conduction in response to the write enable signal WE. Instead of using the transfer gate circuit T3, the AND gate circuit G7 can be adapted as a tristate type that is activated according to the write enable signal WE. With this configuration, in a write test operation, the internal clock signal CLKI is supplied to the input buffer IB in the I/O buffer unit 16. On the other hand, in a leak test operation, the output signal from the latch circuit TCs01 is supplied to the data strobe terminal DQS0.

The circuit TCs03 included in the test circuit unit TCUs0 includes a complex gate circuit G8 that selects either data on the data strobe line DQS0L or the read test data DQ0 to DQ7 supplied from the test circuit units TCU at the previous stages based on the output signal from the latch circuit TCs01. An output signal from the complex gate circuit G8 is input to the complex gate circuit G1. With this configuration, when the output signal from the latch circuit TCs01 is at a low level, the read test data DQ0 to DQ7 transferred from the test circuit units TCU at the previous stages are supplied with no change to the test circuit unit TCUm0 via the test circuit unit TCUs0.

While the test circuit units TCU/s0, TCUs1, and TCU/s1 have the same circuit configuration as that mentioned above, the internal clock signal CLKI inverted is supplied to the test circuit units TCU/s0 and TCU/s1. Accordingly, in a write test operation, the data strobe signals supplied from the test circuit units TCUs0 and TCU/s0 to the I/O buffer unit 16 are complementary to each other and, similarly, the data strobe signals supplied from the test circuit units TCUs1 and TCU/s1 to the I/O buffer unit 16 are complementary to each other. The data strobe signals output from the test circuit units TCUs0 and TCU/s0 specify a latch timing of the write test data DQ0 to DQ7 and the data strobe signals output from the test circuit units TCUs1 and TCU/s1 specify a latch timing of the write test data DQ8 to DQ15.

Figure 7:
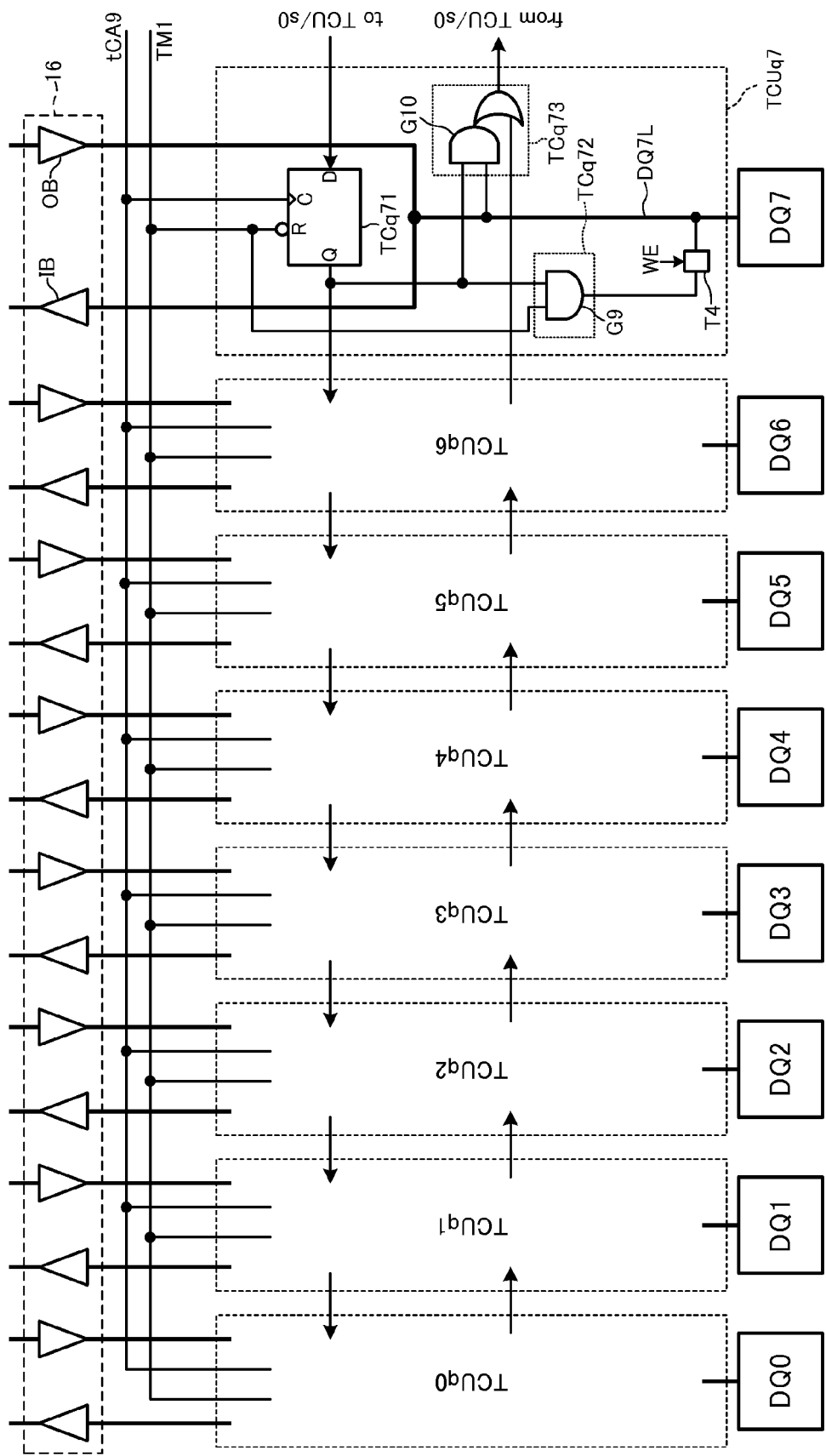
FIG. 7 is a circuit diagram of the test circuit unit TCUq7 shown in FIG. 5.

Turning to FIG. 7, a circuit TCq71 included in the test circuit unit TCUq7 has the same circuit configuration as that of the latch circuit TCs01 shown in FIG. 6 and is cascaded with latch circuits included in other test circuit units TCU, thereby forming a shift register. That is, the data input node D of the latch circuit TCq71 is connected to the data output node Q of the latch circuit included in the test circuit unit TCU at the previous stage, and the data output node Q of the latch circuit TCq71 is connected to the data input node D of the latch circuit included in the test circuit unit TCU at the subsequent stage. The test control signal tCA9 is supplied to the clock input node C.

A circuit TCq72 included in the test circuit unit TCUq7 includes an AND gate circuit G9 that receives the test mode signal TM1 and an output signal from the latch circuit TCq71. An output signal from the AND gate circuit G9 is supplied to a data input/output line DQ7L via a transfer gate circuit T4. The transfer gate circuit T4 is brought into conduction in response to the write enable signal WE. Instead of using the transfer gate circuit T4, the AND gate circuit G9 can be adapted as a tristate type that is activated according to the write enable signal WE. With this configuration, the output signal from the latch circuit TCq71 is supplied to the input buffer IB in the I/O buffer unit 16 in a write test operation.

A circuit TCq73 included in the test circuit unit TCUq7 includes a complex gate circuit G10 that selects either data on the data input/output line DQ7L or the read test data DQ0 to DQ6 supplied from the test circuit units TCU at the previous stages based on the output signal from the latch circuit TCq71. With this configuration, the data on the data input/output line DQ7L are supplied to the test circuit unit TCUm0 when the output signal from the latch circuit TCq71 is at a high level, and the read test data DQ0 to DQ6 transferred from the test circuit units TCU at the previous stages are supplied with no change to the test circuit unit TCUm0 via the test circuit unit TCUq7 when the output signal from the latch circuit TCq71 is at a low level.

Other test circuit units TCUq0 to TCUq6 and TCUq8 to TCUq15 have the same circuit configuration as that mentioned above. As explained in association with FIG. 5, the test circuit units TCUq0 to TCUq7, TCU/s0, and TCUs0 form a group on the left side in relation to the data mask terminal DM0, and the latch circuits included therein form a shift register. The test circuit units TCUq8 to TCUq15, TCU/s1, and TCUs1 form a group on the right side in relation to the data mask terminal DM0, and the latch circuits included therein form a shift register.

In a normal operation, the test mode signals TM1 to TM3 are all at a low level and thus the test circuit units TCU do not exercise any influence on the corresponding terminals. Accordingly, pieces of write data that are input to the data input/output terminals DQ0 to DQ15 in a normal write operation are supplied to the input buffer IB included in the I/O buffer unit 16 via the data input/output lines DQ0L to DQ15L, respectively. Ina normal read operation, pieces of read data that are output from an output buffer OB included in the I/O buffer unit 16 are output to the data input/output terminals DQ0 to DQ15 via the data input/output lines DQ0L to DQ15L, respectively.

An operation of the semiconductor device 10 according to the present embodiment is explained next.

At first, a write test operation of the semiconductor device 10 is explained with reference to FIG. 8.

Figure 8:
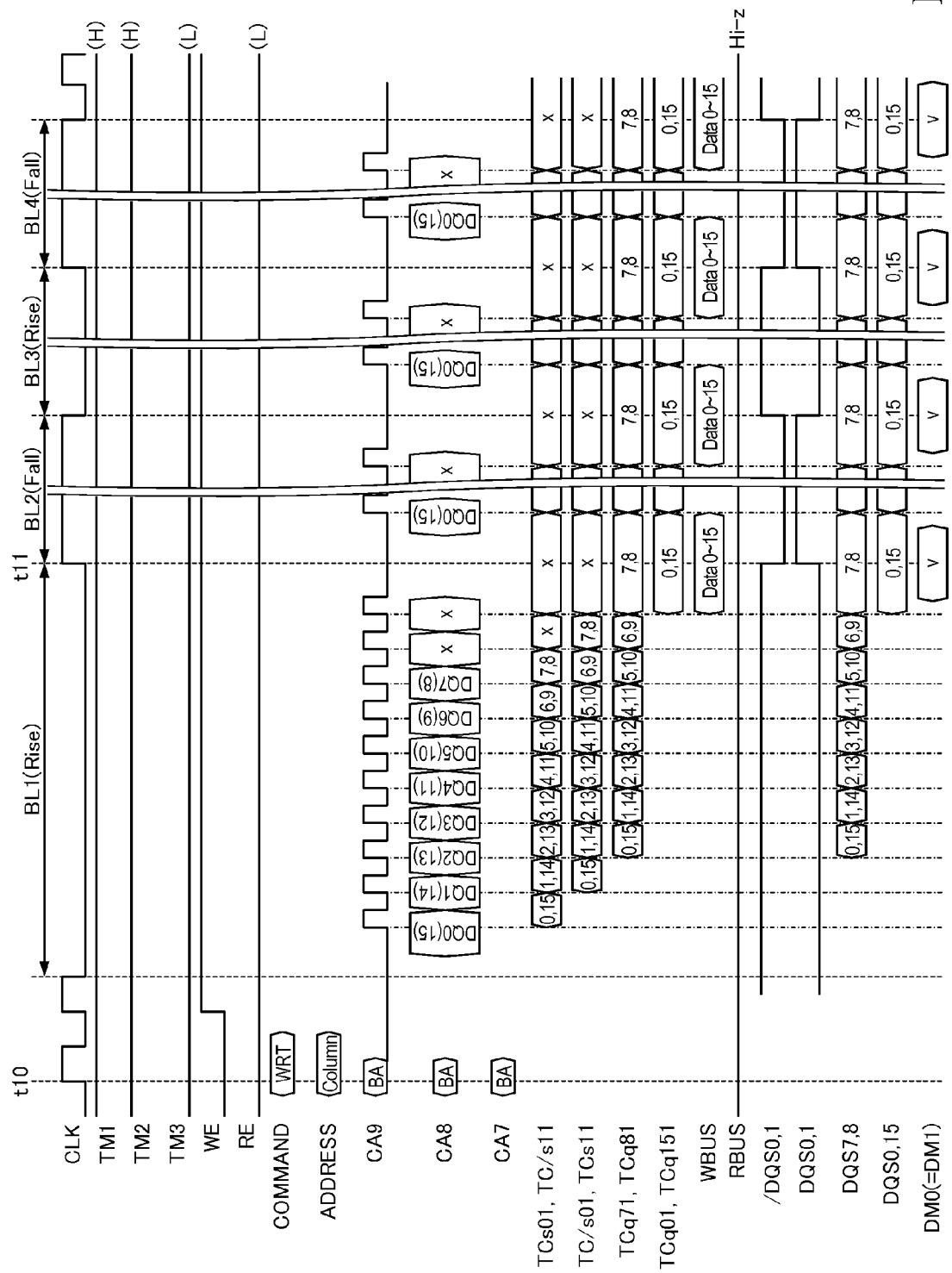
FIG. 8 is a timing chart for explaining a write test operation of the semiconductor device according to the first embodiment of the present invention.

In an example shown in FIG. 8, a test command is issued prior to a time t10 and the test mode signals TM1 and TM2 are changed to a high level in response thereto. The test mode signal TM3 is kept at a low level. This causes the semiconductor device 10 to enter a test mode. When a write command WRT and a column address are input at the time t10 after entry to the test mode, a write test is started. These command and address are included in the command address signal CA. While being previously input prior to the time t10, an active command and a row address are not shown. The command address signals CA7 to CA9 in the command address signal CA supplied at the time t10 are used as bank addresses.

When the write test is started, clocking of the external clock signal CLK is stopped to fix the external clock signal CLK at a low level. When a predetermined time has passed from issuance of the write command WRT, the write enable signal WE is activated.

In the write test, the write test data DQ0 (15) to DQ7 (8) are serially supplied from the tester via the command address terminal CA8, and a shift clock signal is supplied synchronously therewith via the command address terminal CA9. The write test data DQ0 to DQ7 and the write test data DQ15 to DQ8 are the same data, and are supplied to the group located on the left side in relation to the data mask terminal DM0 and the group located on the right side, respectively. Because each of the groups includes the two test circuits TCU assigned to the data strobe terminal DQS, the shift clock signal (CA9) needs to be clocked 10 (=8+2) times. The command address signals CA8 corresponding to last two times of clocking are invalid data because they are latched by the two test circuit units TCU assigned to the data strobe terminal DQS.

When the write test data DQ0 (15) to DQ7 (8) are serially input in this way, the write test data DQ0 to DQ15 are latched by the latch circuits in the corresponding test circuit units TCUq0 to TCUq15, respectively. At that time, the test mode signal TM1 and the write enable signal WE are both in a state activated at a high level, and thus the write test data DQ0 to DQ15 latched by the latch circuits in the test circuit units TCUq0 to TCUq15 are supplied to the corresponding data input/output lines DQ0L to DQ15L, respectively. Therefore, the write test data DQ0 to DQ15 are supplied to the corresponding input buffers IB in the I/O buffer unit 16, respectively, and the buffered write test data DQ0 to DQ15 are supplied to the data control circuit 15 via the write bus WBUS.

When the external clock signal CLK is changed to a high level at a time t11, the strobe signals on the data strobe lines DQS0L, DQS/0L, DQS1L, and DQS/1L are inverted. Synchronously therewith, the write test data DQ0 to DQ15 on the write bus WBUS are latched by the data latch circuit 15a in the data control circuit 15. In this way, input of the write test data DQ0 to DQ15 corresponding to one burst is completed. At the time t11, also the data mask signal can be input (which is denoted by V in FIG. 8).

The same operation is then repeated to by the number of times corresponding to a burst length, so that the write test data DQ0 to DQ15 are sequentially supplied to the data control circuit 15 and are subjected to serial-parallel conversion by the data control circuit 15. In the example shown in FIG. 8, the burst length is 4 bits and therefore 64 bits of write test data in total are supplied to the memory cell array 11 via the data input/output line LIO. The write test operation is performed in this way.

As described above, because pieces of write test data are serially input via the command address terminal CA8 in the write test operation without using the data input/output terminals DQ0 to DQ15 and the data strobe terminal DQS, there is no need to apply the probe needles of the probe card to the data input/output terminals DQ0 to DQ15 and the data strobe terminal DQS. Furthermore, arbitrary write test data can be supplied to each of the data input/output terminals DQ0 to DQ15.

Figure 9:
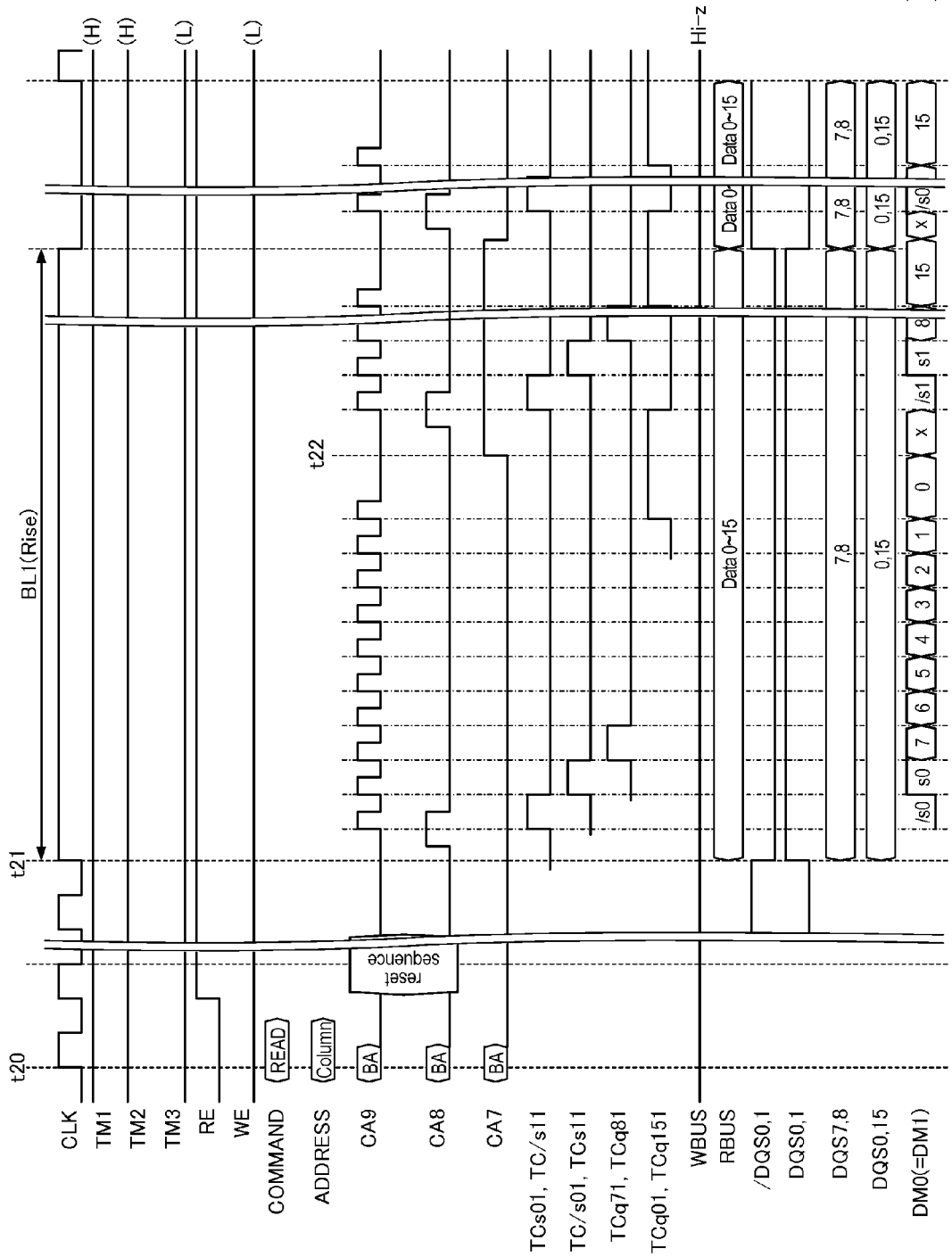
FIG. 9 is a timing chart for explaining a read test operation of the semiconductor device according to the first embodiment of the present invention.

The read test operation shown in FIG. 9 is executed following the write test operation mentioned above and is an operation to read the write test data written in the memory cell array 11 in the write test operation.

In an example shown in FIG. 9, a test command is input prior to a time t20 and the test mode signals TM1 and TM2 are changed to a high level in response thereto. The test mode signal TM3 is kept at a low level. This causes the semiconductor device 10 to enter a test mode. When a read command READ and a column address are input at the time t20 after entry to the test mode, a read test is started. These command and address are included in the command address signal CA. While being previously input prior to the time t20, an active command and a row address are not shown.

When a predetermined time has passed after issuance of the read command READ, the read enable signal RE is activated.

In the read test, a reset sequence is first executed to reset the latch circuits included in the test circuit units TCU. The reset sequence is performed by clocking the command address signal CA9 in a state where the command address signal CA8 is fixed at a low level.

When the read test data DQ0 to DQ15 appear on the read bus RBUS at a time 21 after the reset sequence is completed, clocking of the external clock signal CLK is stopped to fix the external clock signal CLK at a high level. The command address signal CA9 is then clocked 10 times. At that time, the command address signal CA8 is temporarily changed to a high level synchronously with the first clocking. This causes a high-level flag signal to be latched by the latch circuits in the test circuit units TCUs0 and TCU/s1 and then shifts latch circuits that latch the flag signal synchronously with subsequent clocking of the command address signal CA9.

Data on the data input/output lines DQ0L to DQ15L in the test circuit units TCU that have the latch circuits latching the flag signal is supplied to the test circuit unit TCUm0. Because the command address signal CA7 is at a low level during a period from the time t21 to a time t22, the data on the data input/output lines DQ0L to DQ7L are selected and serially output from the data mask terminal DM0 in response to clocking of the command address signal CA9. The command address signal CA7 changes to a high level at the time t22 and accordingly the data on the data input/output lines DQ8L to DQ15L are selected in turn. These pieces of data are also serially output from the data mask terminal DM0 in response to clocking of the command address signal CA9. In this way, output of the read test data DQ0 to DQ15 corresponding to one burst is completed.

The same operation is then repeated by the number of times corresponding to the burst length with the external clock signal CLK being inverted, so that the read test data that are read from the memory cell array 11 are sequentially output from the data mask terminal DM0. The external clock signal CLK is inverted to perform serial conversion of the parallel read test data that are read from the memory cell array 11 in the data control circuit 15. The read test operation is performed in this way.

As described above, also in the read test operation, the pieces of read test data are serially output through the data mask terminal DM0 without using the data input/output terminals DQ0 to DQ15 and the data strobe terminal DQS, which eliminates the need to apply the probe needles of the probe card to the data input/output terminals DQ0 to DQ15 and the data strobe terminal DQS. Furthermore, because the pieces of read test data are not compressed, arbitrary test data written in arbitrary memory cells can be read out without being processed.

Figure 10:
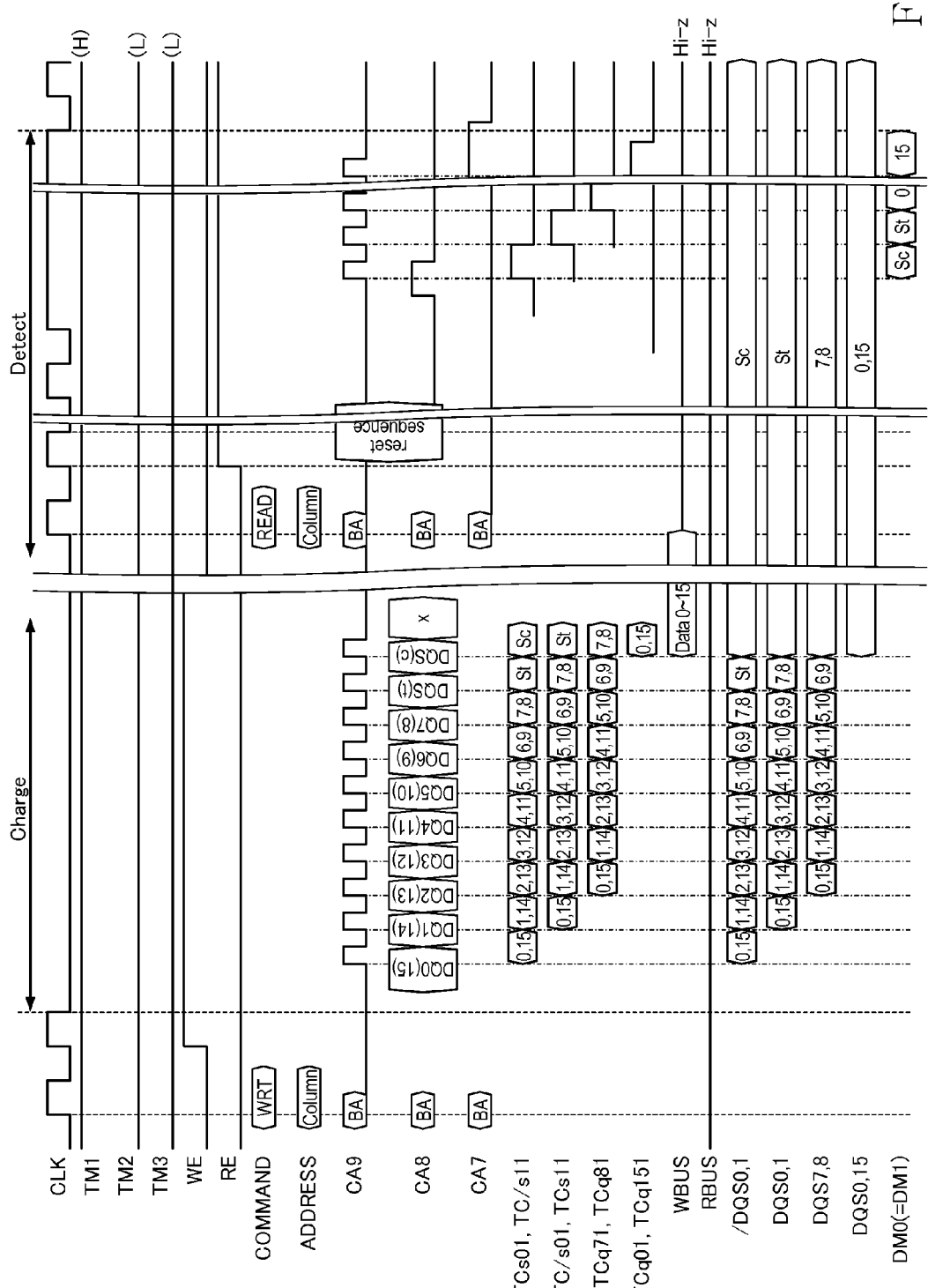
FIG. 10 is a timing chart for explaining a leak test operation of the semiconductor device according to the first embodiment of the present invention.

The leak test operation shown in FIG. 10 is related to the data input/output terminals DQ0 to DQ15 and the data strobe terminal DQS. A leak test operation related to the data mask terminals DM0 and MD1 will be explained later.

A leak test is for testing whether there is no current leak path in each terminal and in a line connected to each terminal, and a charge operation and a detect operation are performed in this order. As shown in FIG. 10, the charge operation is basically the same as the write test operation and the detect operation is basically the same as the read test operation. However, the leak test operation is different from the write test operation and the read test operation in that the test mode signal TM2 is set at a low level in the leak test operation. When the test mode signal TM2 is set at a low level, the complex gate circuit G6 shown in FIG. 6 selects the output signal from the latch circuit TCUs01 and thus can supply the write test data also to the data strobe terminal DQS.

When the charge operation is completed, the write enable signal WE returns to a low level and accordingly the terminals DQ0 to DQ15 and DQS temporarily become a floating state. If there is no current leak path in each of the terminals DQ0 to DQ15 and DQS, potential applied in the charge operation is maintained and accordingly, when the detect operation is then performed, it is expected that test data at the same logic level as those of the test data written in the charge operation are read. If there is a current leak path, the potential applied in the charge operation is changed by leak and thus, when the detect operation is then performed, pieces of test data at different logic levels from those of the test data written in the charge operation are read. The tester can detect presence or absence of the current leak path in this way.

A sufficient interval to cause leak to become obvious is required between the charge operation and the detect operation. When a read operation corresponding to the detect operation is executed, a read latency needs to be set at least at a larger value than the number of clocks in the external clock signal CLK in a detect period (a period from input of a read command to output of a test result of the data input/output terminal DQ15), for example, at 8. When the read latency is set longer, collision between the read data that are actually read from the memory cell array 11 and the potential of the charged terminal can be avoided.

As described above, also in the leak test operation, there is no need to use the data input/output terminals DQ0 to DQ15 and the data strobe terminal DQS.

Although not shown, the leak test operation related to the data mask terminals DM0 and DM1 is performed in a different sequence from that mentioned above. A leak test on the data mask terminal DM0 is executed by simply performing a charge operation via a probe needle applied to the data mask terminal DM0 and then performing a detect operation via the probe needle applied to the data mask terminal DM0 after a predetermined time has passed.

Meanwhile, a leak test on the data mask terminal DM1 is executed by performing a charge operation via a probe needle applied to the data mask terminal DM0 in a state where the test mode signals TM1 and TM3 are at a high level. Data provided to the data mask terminal DM0 is supplied to the data mask terminal DM1 via the AND gate circuits G3 and G4, which means that pieces of data at the same logic level are provided to the data mask terminal DM1. After a predetermined period has passed, a detect operation is then performed via the probe needle applied to the data mask terminal DM0. That is, the data provided to the data mask terminal DM1 are fed back to the data mask terminal DM0 via the complex gate circuits G5 and G1 and the AND gate circuit G2, and accordingly the detect operation can be performed via the data mask terminal DM0. At that time, because feedback is performed from the data mask terminal DM1 to the data mask terminal DM0, it is necessary to set the command address CA7 at a high level and to activate the read enable signal RE.

As described above, in the present embodiment, the leak test operation can be also performed for the data mask terminals DM0 and DM1.

Next, a normal operation is briefly explained.

First, in a normal write operation, plural pieces of write data are burst-input via the data input/output terminals DQ0 to DQ15. Synchronously therewith, the data strobe signal is also supplied to the data strobe terminal DQS. The plural pieces of burst-input write data are subjected to serial-parallel conversion in the data control circuit 15 and then written in parallel in the memory cell array 11 via the data input/output line LIO. In the normal write operation, the data mask signal is supplied to the data mask terminals DM0 and DM1 as needed. Unlike in the test operation, the supplied data mask signal is a signal independently controlled with respect to each of the data mask terminals DM0 and DM1.

Meanwhile, in a normal read operation, plural pieces of read data corresponding to the burst length are output in parallel from the memory cell array 11 via the data input/output line LIO. The plural pieces of read data are subjected to parallel-serial conversion in the data control circuit 15 and then burst-output from the data input/output terminals DQ0 to DQ15. Synchronously therewith, the data strobe signal is also output from the data strobe terminal DQS. In the read operation, the data mask signal is not used.

As explained above, the semiconductor device 10 according to the present embodiment can perform the write test operation and the read test operation without using the data input/output terminals DQ0 to DQ15 and the data strobe terminal DQS. Therefore, there is no need to apply probe needles of a probe card to these terminals. Accordingly, when the operation test is performed in a wafer state, more semiconductor devices can be tested in parallel. Furthermore, arbitrary test data can be written in each of the data input/output terminals, which enables the shipping final test to be performed in a wafer state.

While the read test data DQ0 to DQ15 corresponding to one burst are serially output by clocking of the command address signal CA9 in the example shown in FIG. 9, the semiconductor device 10 according to the first embodiment of the present invention can selectively burst-output specific read test data DQk (k=0 to 15).

Figure 11:
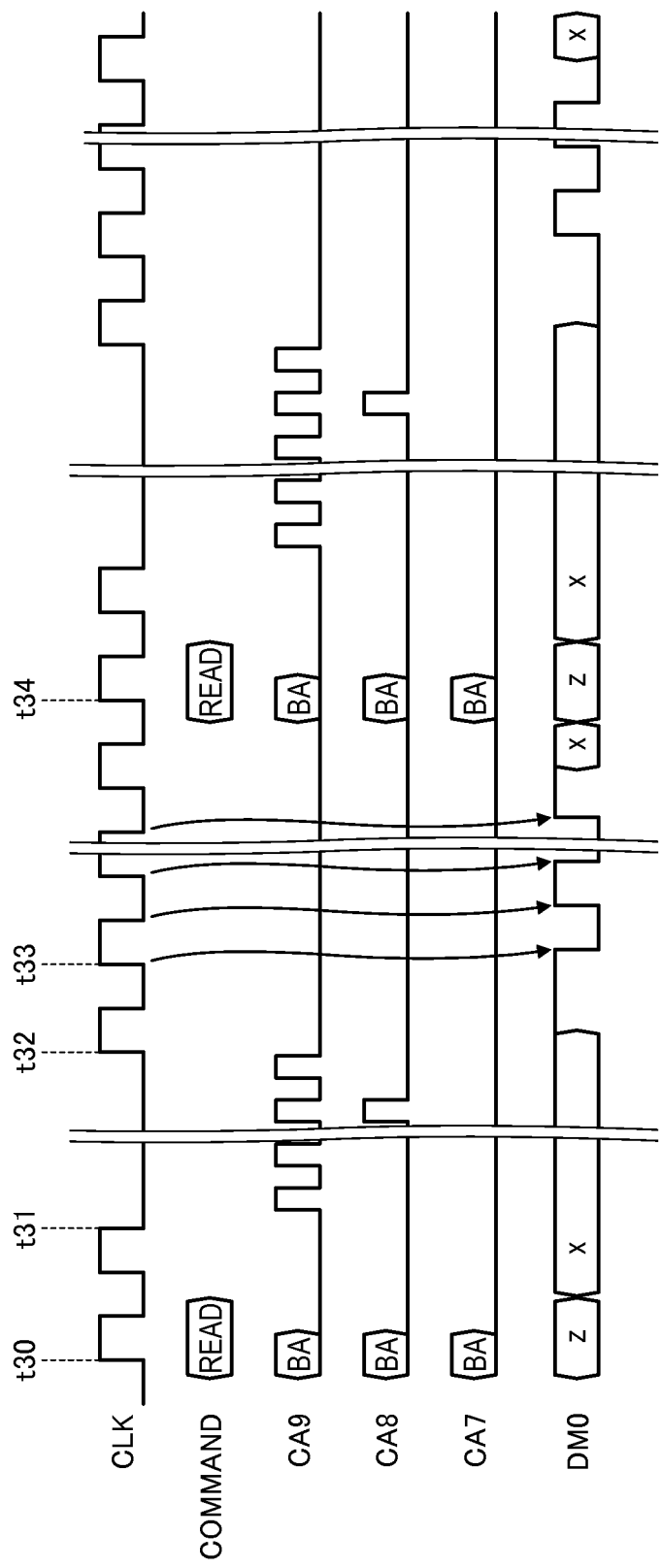
FIG. 11 is a timing chart for explaining a method of selectively burst-outputting specific read test data DQk.

In an example shown in FIG. 11, a test command is input prior to a time t30 and the test mode signals TM1 and TM2 have a high level and the test mode signal TM3 has a low level. When a read command READ and a column address are input at the time t30 in this state, a read test is started. While being previously input prior to the time t30, an active command and a row address are not shown in FIG. 11.

In this example, after a reset sequence (not shown) is executed, clocking of the clock signal CLK is stopped during a period from a time t31 to a time t32. The command address signal CA9 is clocked during this period and the command address signal CA8 is changed to a high level only once in the middle of the period. This causes a high-level flag signal to be latched by one of the latch circuits TCq01 to TCq71 and one of the latch circuits TCq81 to TCq151 (TCqk1). Which one of the latch circuits is caused to latch the flag signal can be arbitrarily selected by a timing at which the command address signal CA8 is changed to a high level.

Because the read latency is set at a 3-clock cycle in this example, the read test data DQk are burst-output synchronously with changes in the clock signal CLK after a time t33. Selection of a group, that is, whether to select the group of the read test data DQ0 to DQ7 or the group of the read test data DQ8 to DQ15 can be controlled by using the command address signal CA7. When such an operation is repeatedly executed, desired read test data DQk can be burst-output. In FIG. 11, x denotes an indefinite value and z denotes a high-impedance state. This holds true for an example explained later with reference to FIG. 15.

However, in the first embodiment of the present invention, the process mentioned above needs to be executed repeatedly each time a read command READ is issued. Therefore, even when read test data DQk to be monitored using the read command READ issued at the time t30 and read command test data DQk to be monitored using a read command READ issued at a time t34 correspond to the same data input/output terminal, the same operation, that is, the operation of setting the command address signal CA8 at a high level only once while clocking the command address signal CA9 needs to be repeated. This adversely increases the test time. The second embodiment of the present invention explained below solves this problem and streamlines an operation that is performed when read test data corresponding to the same input/output terminal are to be repeatedly burst-output.

Figure 12:
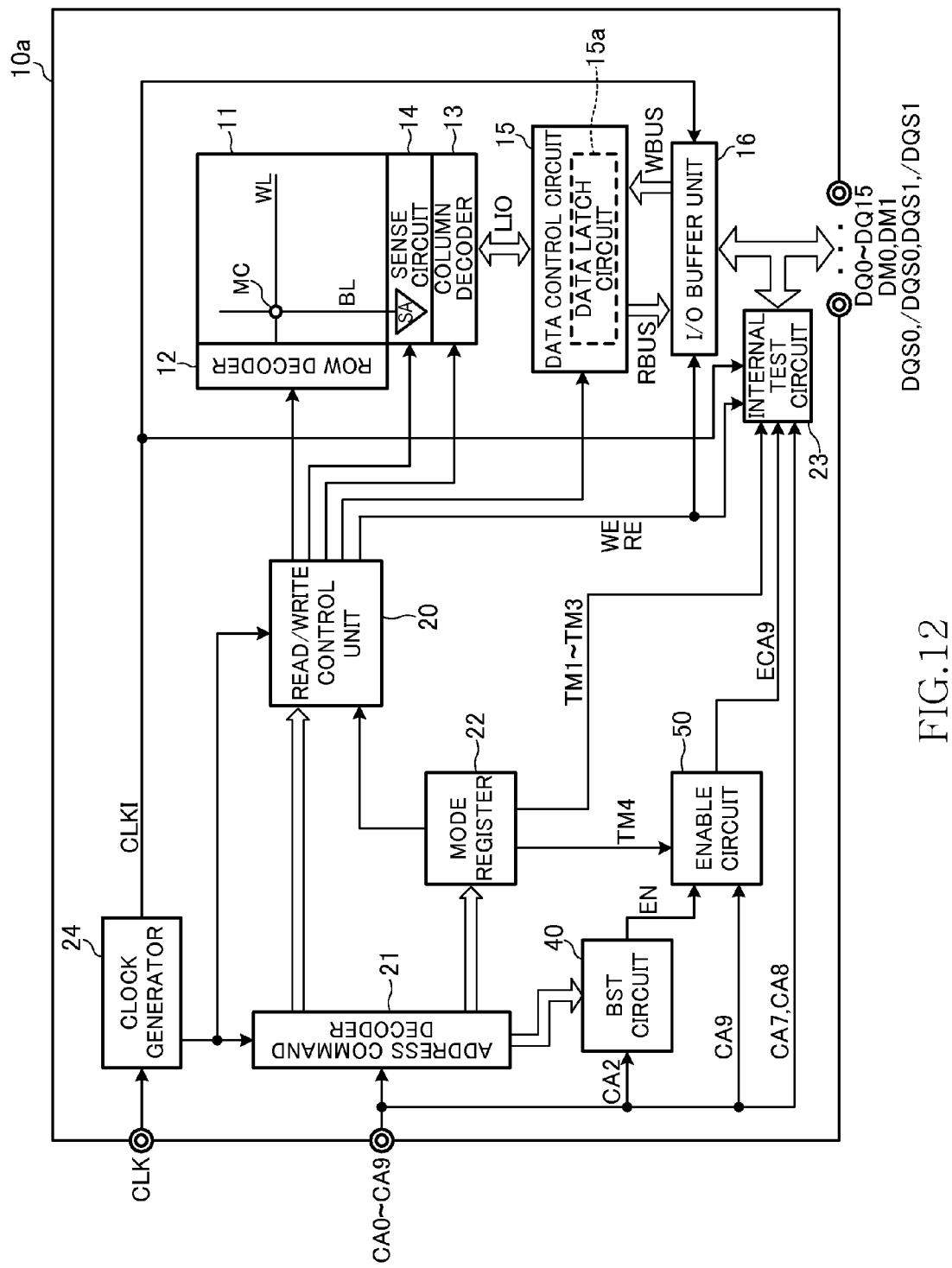
FIG. 12 is a block diagram showing a configuration of a semiconductor device according to a second embodiment of the present invention.

Turning to FIG. 12, the semiconductor device 10a according to the second embodiment of the present invention is different from the semiconductor device 10 according to the first embodiment in that a BST (Burst Terminate) circuit and an enable circuit 50 are added. Because other constituent elements are the same as those in the semiconductor device 10 according to the first embodiment, like elements are denoted by like reference characters and redundant explanations thereof will be omitted.

The BST circuit 40 is a circuit for stopping a burst operation halfway and generates an enable signal EN by using the command address signal CA2 that is not required to control the primary function of the BST circuit 40 in the present embodiment. Specifically, after a BST command is issued synchronously with a rise edge of the clock signal, a logic level of the enable signal EN is controlled based on a logic level of the command address signal CA2 input synchronously with a fall edge of the clock signal. The circuit for generating the enable signal EN is not limited to the BST circuit 40 and is not particularly limited as long as the circuit can obtain a signal which is not necessary to control the primary function of the circuit, such as the command address signal CA2 input synchronously with a fall edge of the clock signal.

The enable circuit 50 receives the enable signal EN, the test mode signal TM4, and the command address signal CA9, and generates an internal command address signal ECA9. The internal command address signal ECA9 is supplied to the internal test circuit 23 and serves the same function as that of the command address signal CA9, which is supplied to the internal test circuit 23 in the first embodiment. The command address signals CA7 and CA8 are supplied directly to the internal test circuit 23 as in the first embodiment.

Figure 13:
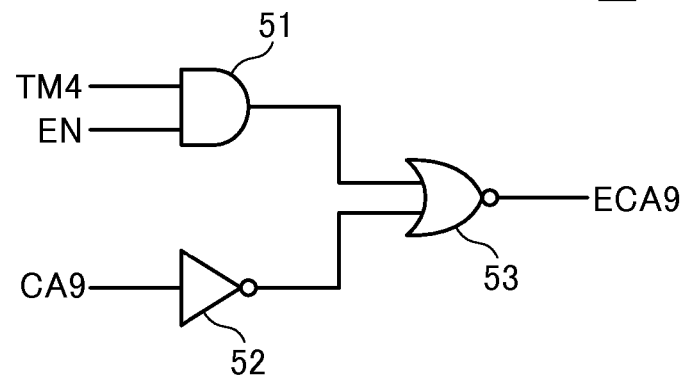
FIG. 13 is a circuit diagram of an enable circuit shown in FIG. 12.

As shown in FIG. 13, the enable circuit 50 includes an AND gate circuit 51 that receives the test mode signal TM4 and the enable signal EN, an inverter 52 that inverts the command address signal CA9, and an NOR gate circuit 53 that receives output signals from the AND gate circuit 51 and the inverter 52. An output from the NOR gate circuit 53 is used as the internal command address signal ECA9. With this configuration, the internal command address signal ECA9 is fixed to a low level when the test mode signal TM4 and the enable signal EN are both at a high level. In other cases, the command address signal CA9 is output as it is as the internal command address signal ECA9.

An operation of the BST circuit 40 will be explained with reference to FIG. 14.

Figure 14:
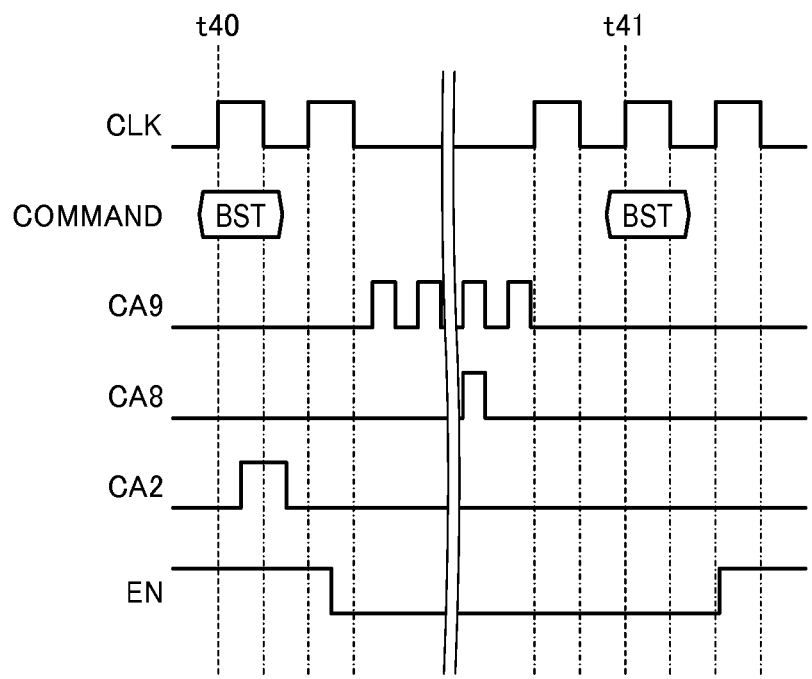
FIG. 14 is a timing chart for explaining an operation of the BST circuit shown in FIG. 12.

In an example shown in FIG. 14, the command address signal CA2 at a high level is input synchronously with a fall edge of the clock signal immediately after a BST command issued at a time t40, and the command address signal CA2 at a low level is input synchronously with a fall edge of the clock signal immediately after a BST command issued at a time t41. In response thereto, the enable signal EN changes to a low level immediately after the time t40 and changes to a high level immediately after the time t41. During a period when the enable signal EN is at a low level, changes in the command address signal CA9 are directly reflected in the internal command address signal ECA9 and thus, when the command address signal CA9 is clocked, the internal command address signal ECA9 is also clocked. In contrast thereto, when the enable signal EN has a high level during a read test or a write test, the internal command address signal ECA9 is fixed to a low level.

In the example shown in FIG. 14, clocking of the clock signal CLK is stopped during a period from the times t40 to t41, the command address signal CA9 is clocked during this period, and the command address signal CA8 is changed to a high level only once in the middle of the period. This causes a high-level flag signal to be latched by one of the latch circuits TCq01 to TCq71 and one of the latch circuits TCq81 to TCq151 (TCqk1). Which one of the latch circuits is caused to latch the high-level flag signal can be arbitrarily selected by a timing at which the command address signal CA8 is changed to a high level. Because the enable signal EN is set at a high level after the time t41, the latch circuits that latch the flag signal are not shifted even when the command address signal CA9 is changed.

Figure 15:
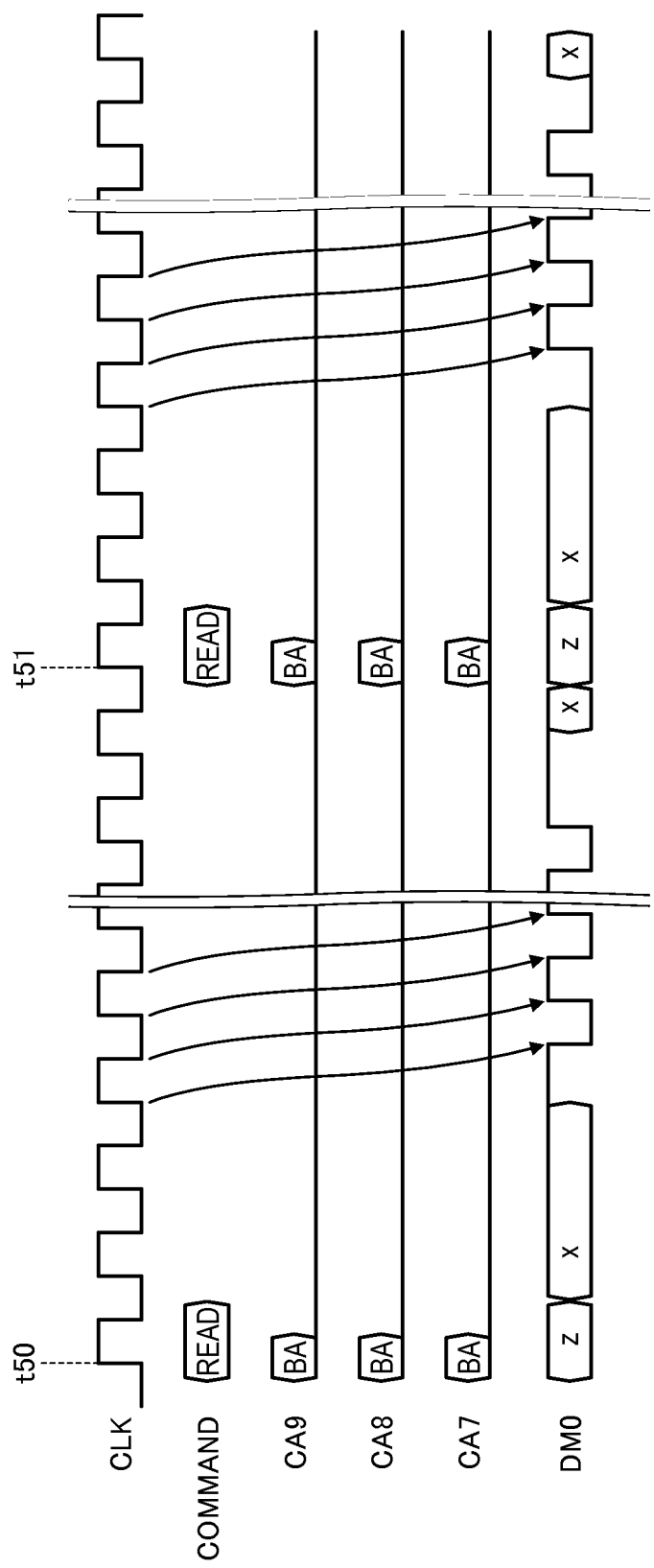
FIG. 15 is a timing chart for explaining a method of selectively burst-outputting specific read test data DQk in the semiconductor device according to the second embodiment of the present invention.

In an example shown in FIG. 15, a high-level flag signal is latched by one of the latch circuits TCqk1 prior to a time t50 according to the operation shown in FIG. 14. When a read command READ and a column address are input in this state at the time t50, read test data DQk are burst-output synchronously with changes in the clock signal CLK after elapse of the 3-clock cycle as the read latency. Selection of a group, that is, whether to select the group of the read test data DQ0 to DQ7 or the group of the read test data DQ8 to DQ15 can be controlled by using the command address signal CA7.

Unless the selected read test data DQk is changed, such an operation can be indefinitely and repeatedly executed with different column addresses. That is, unlike the example explained with reference to FIG. 11, the operation of selecting the read test data DQk according to clocking of the command address signal CA9 does not need to be performed each time. This operation can be performed because changes in the internal command address signal ECA9 are prevented by activation of the enable signal EN. That is, when changes in the internal command address signal ECA9 are not prevented as in the first embodiment, the latch circuits that latch a high-level flag are shifted when the command address signal CA9 is input with issuance of a read command READ. However, in the present embodiment, such shifting does not occur. Therefore, burst output of the read test data DQk can be promptly executed by inputting a different column address at a time t51 without execution of the operation shown in FIG. 14 again.

As described above, according to the present embodiment, the test time required when specific read test data DQk are selectively burst-output can be reduced.

Figure 16:
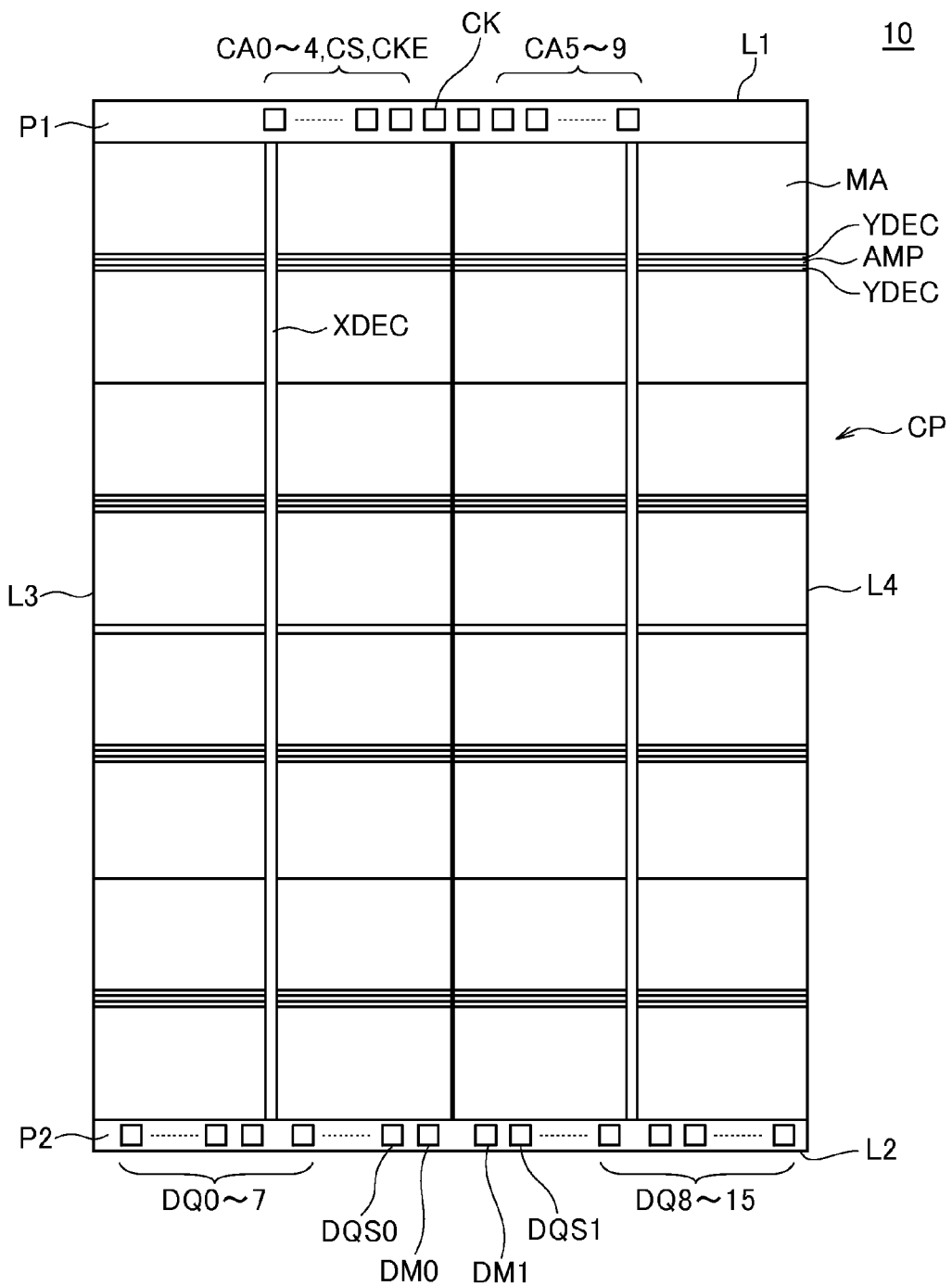
FIG. 16 is a schematic plan view for explaining a layout of the semiconductor device to which the first and second embodiments of the present invention can be applied.

Turning to FIG. 16, the semiconductor device 10 and 10a according to the first and second embodiments of the present invention may be integrated on one silicon chip CP. The primary surface of the silicon chip CP is rectangular and has first and second sides L1 and L2 that are parallel to each other and third and fourth sides L3 and L4 that intersect with the sides L1 and L2 and are parallel to each other. The semiconductor device 10 and 10a according to the first and second embodiments of the present invention has a first peripheral circuit area P1 provided along the first side L1 and a second peripheral circuit area P2 provided along the second side L2. A memory cell array MA is located between the first peripheral circuit area P1 and the second peripheral circuit area P2.

The first peripheral circuit area P1 is an area in which a plurality of command-address-related external terminals and access control circuits associated therewith are arranged. The external terminals arranged in the first peripheral circuit area P1 include a clock terminal to which the external clock signal CLK is input, the command address terminal to which the command address signals CA0 to CA9 are input, a chip select terminal to which a chip select signal CS is input, a clock enable terminal to which a clock enable signal CKE is input, and the like. The access control circuits include an address latch circuit, a command decoder, a clock generation circuit, and the like.

The second peripheral circuit area P2 is an area in which a plurality of data-related external terminals and data control circuits associated therewith are arranged. The external terminals arranged in the second peripheral circuit area P2 include the data terminals DQ0 to DQ15 that perform output of read data and input of write data, the strobe terminals that perform input/output of the strobe signals DQS0 and DQS1, the data mask terminals DM0 and DM1 for performing masking of write data, and the like. The data control circuits include a data output circuit, a data input circuit, a strobe control circuit, and the like. In this way, the data mask terminals DM0 and DM1 and the data terminals DQ0 to DQ15 are provided along the same side L2 of the silicon chip CP.

It is apparent that the present invention is not limited to the above embodiments, but may be modified and changed without departing from the scope and spirit of the invention.

For example, while a case of applying the present invention to a DRAM has been explained in the above embodiment, the application target of the present invention is not limited thereto. Therefore, the present invention can be applied to various types of semiconductor memory devices other than a DRAM, such as an SRAM, a flash memory, and a ReRAM. The present invention can be also applied to a composite semiconductor device in which a logic device such as a CPU or a DSP has memory cell arrays incorporated therein.

While the command address terminal CA8 is used to serially input the write test data in the embodiment mentioned above, this is merely an example and another terminal connected in common to a plurality of semiconductor devices at the time of a test can be used.

Similarly, while the plural pieces of read test data are serially output from the data mask terminal DM0 in the embodiment mentioned above, this is merely an example and another terminal that can be connected individually to a plurality of semiconductor devices at the time of a test can be used.

Furthermore, while the semiconductor device having 16 data input/output terminals (DQ0 to DQ15) is explained in the embodiments as examples, the present invention is not limited thereto and, for example, 32 data input/output terminals can be provided. In this case, it suffices to provide four pairs of (eight in total) complementary data strobe terminals and four data mask terminals.

What is claimed is:
1. A semiconductor device comprising:
a plurality of first terminals;

a plurality of second terminals, the second terminals being configured to receive a plurality of first test data in serial in a first test operation and to receive a shift clock signal in a second test operation;
a third terminal;
a plurality of buffer circuits;
a plurality of data input/output lines each coupled between an associated one of the first terminals and an associated one of the buffer circuits; and
a plurality of test circuit units, wherein each test circuit unit is coupled to an associated one of the data input/output lines by being connected to the associated data input/output line at a location between the first terminal associated with the associated data input/output line and the buffer circuit associated with the associated data input/output line, the test circuit units being connected in series, wherein
in the first test operation, the plurality of first test data are sequentially supplied to the test circuit units, and the test circuit units supply the plurality of first test data to the data input/output lines in parallel, and
in the second test operation, a plurality of second test data supplied from the buffer circuits are supplied in parallel to the test circuit units, and the test circuit units serially output the plurality of second test data through the third terminal synchronously with the shift clock signal.

2. The device as claimed in claim 1, wherein
the second terminals includes a first command address terminal supplied with the plurality of first test data, and a second command address terminal supplied with the shift clock signal, and
in the first test operation, the plurality of first test data are serially supplied from outside through the first command address terminal, and the plurality of first test data are sequentially transferred to the test circuit units synchronously with the shift clock signal.

3. The device as claimed in claim 2, wherein in the second test operation, a flag signal supplied from the first command address terminal is held by one of the test circuit units, the flag signal is shifted among the test circuit units synchronously with the shift clock signal, and the test circuit unit that has the flag signal held therein supplies an associated one of the plurality of second test data to the third terminal.

4. The device as claimed in claim 3, wherein
the first terminals include a plurality of first data input/output terminals and a plurality of second data input/output terminals,
the second terminals further includes a third command address terminal supplied with a selection signal, and
in the second test operation, the second test data corresponding to one of the first and second data input/output terminals are supplied to the third terminal based on the selection signal.

5. The device as claimed in claim 1, wherein the test circuit units serially output the plurality of first test data through the third terminal synchronously with the shift clock signal supplied from one of the second terminals in a leak test operation after performing the first test operation.

6. The device as claimed in claim 1, wherein in a normal operation, a plurality of first data supplied in parallel via the first terminals are supplied in parallel to the buffer circuits via the data input/output lines, and second data output in parallel from the buffer circuits via the data input/output lines are output in parallel to the first terminals.

7. The device as claimed in claim 1, further comprising:
a fourth terminal supplied with a clock signal; and
a data latch circuit that latches the plurality of first test data in parallel on the data input/output lines synchronously with the clock signal.

8. The device as claimed in claim 1, wherein the first terminals includes a plurality of data terminals and a data strobe terminal.

9. The device as claimed in claim 1, wherein the third terminal is a data mask terminal.

10. A semiconductor device comprising:
a plurality of first terminals;
a plurality of second terminals, the second terminals being configured to receive a plurality of first test data in serial in a first test operation and to receive a shift clock signal in a second test operation;
a third terminal;
a plurality of buffer circuits;
a plurality of data input/output lines each coupled between an associated one of the first terminals and an associated one of the buffer circuits; and
a plurality of test circuit units each coupled to an associated one of the data input/output lines, the test circuit units being connected in series, wherein
in the first test operation, the plurality of first test data are sequentially supplied to the test circuit units, and the test circuit units supply the plurality of first test data to the data input/output lines in parallel,
in the second test operation, a plurality of second test data supplied from the buffer circuits are supplied in parallel to the test circuit units, and the test circuit units serially output the plurality of second test data through the third terminal synchronously with the shift clock signal,
the second terminals includes a first command address terminal supplied with the plurality of first test data, and a second command address terminal supplied with the shift clock signal,
in the first test operation, the plurality of first test data are serially supplied from outside through the first command address terminal, and the plurality of first test data are sequentially transferred to the test circuit units synchronously with the shift clock signal, and
in the second test operation, a flag signal supplied from the first command address terminal is held by one of the test circuit units, the flag signal is shifted among the test circuit units synchronously with the shift clock signal, and the test circuit unit that has the flag signal held therein supplies an associated one of the plurality of second test data to the third terminal.

11. The device as claimed in claim 10, wherein
the first terminals include a plurality of first data input/output terminals and a plurality of second data input/output terminals,
the second terminals further includes a third command address terminal supplied with a selection signal, and
in the second test operation, the second test data corresponding to one of the first and second data input/output terminals are supplied to the third terminal based on the selection signal.

* * * * *